United States Patent
Goedl et al.

(10) Patent No.: US 6,821,693 B2
(45) Date of Patent: Nov. 23, 2004

(54) METHOD FOR ADJUSTING A MULTILEVEL PHASE-SHIFTING MASK OR RETICLE

(75) Inventors: Gernot Goedl, Ismaning (DE); Dirk Loeffelmacher, Taufkirchen (DE); Timo Wandel, München (DE)

(73) Assignee: Infineon Technologies AG, Munich (DE)

( * ) Notice: Subject to any disclaimer, the term of this patent is extended or adjusted under 35 U.S.C. 154(b) by 119 days.

(21) Appl. No.: 10/233,970

(22) Filed: Sep. 3, 2002

(65) Prior Publication Data

US 2003/0044698 A1 Mar. 6, 2003

(30) Foreign Application Priority Data

Aug. 31, 2001 (DE) ......................................... 101 42 593

(51) Int. Cl.$^7$ ................................................. G03C 5/00
(52) U.S. Cl. ....................... 430/22; 430/296; 430/942; 250/491.1; 250/492.2; 250/492.21; 250/492.3
(58) Field of Search .......................... 430/22, 296, 942; 250/491.1, 492.2, 492.21, 492.3

(56) References Cited

U.S. PATENT DOCUMENTS 4,871,919 A    10/1989  Donohue et al.
5,733,708 A     3/1998  Catanzaro et al.
2002/0081815 A1  6/2002  Fujiwara et al.

FOREIGN PATENT DOCUMENTS

JP    2000 223 404 A    8/2000
JP    2000 252 204 A    9/2000

OTHER PUBLICATIONS

Sven Brinkmann: "Entwurf and Herstellung von Fresnel–Zonen–Linsen" [design and manufacturing of Fresnel–zone lenses], *Diplomarbeit, Lehrstuhl für angewandte Optik, Universität Erlangen–Nürnberg*, Jun. 1993, chapter 5.4, pp. 49–51.

*Primary Examiner*—Christopher G. Young
(74) *Attorney, Agent, or Firm*—Laurence A. Greenberg; Werner H. Stemer; Ralph E. Locher

(57) ABSTRACT

A method for adjusting (aligning) a multilevel phase-shifting mask or a multilevel phase-shifting reticle with the aid of at least one alignment mark provided on the mask or the reticle includes the steps of applying or introducing at least two alignment marks onto or into the substrate of the mask or of the reticle in a first step before the first exposure step of the mask or of the reticle, in a second step, coating at least the alignment marks produced in the first step and the regions immediately surrounding them with a thin conducting layer, and, for all following alignment steps of the plurality of mask levels, raster-scanning these alignment marks applied in the first step with an uncharged or charged particle or photon beam.

17 Claims, 1 Drawing Sheet

METHOD FOR ADJUSTING A MULTILEVEL PHASE-SHIFTING MASK OR RETICLE

BACKGROUND OF THE INVENTION

Field of the Invention

The invention relates to a method for adjusting a multilevel phase-shifting mask or a multilevel phase-shifting reticle with the aid of at least one alignment mark applied to the mask or the reticle.

The basis for exposing the levels of a multilevel phase-shifting mask is the correct alignment with alignment structures. Raster-scanning of the mask/reticle to find these alignment structures with the aid of an electron beam has so far not been possible because of the electric charging of the substrate irradiated with charged particles, or has led to unreliable adjustments because of a reduction in the resolution. Optical recognition of the alignment marks is not possible with the required resolution for future generations of technology.

So far, alignment marks that have been optically evaluated with the aid of a laser beam starting from the second level during exposure have been written in the first exposure step of the mask or the reticle.

SUMMARY OF THE INVENTION

It is accordingly an object of the invention to provide a method for adjusting a multilevel phase-shifting mask or a multilevel phase-shifting reticle that overcomes the hereinafore-mentioned disadvantages of the heretofore-known devices and methods of this general type and that renders possible the detection of alignment marks with a very high accuracy with the aid of charged and uncharged particle or photon beams, and, thereby, renders possible a very accurate positioning of a plurality of levels of a mask or a reticle one above another.

With the foregoing and other objects in view, there is provided, in accordance with the invention, a method for adjusting a mask device, including the steps of, in a first step, before a first exposure of a mask device having a substrate, one of applying at least two alignment marks onto the substrate of the mask device and introducing at least two alignment marks into the substrate of the mask device, and, in a second step, coating at least the alignment marks and regions immediately surrounding the alignment marks with a conducting layer and raster-scanning the alignment marks for all following alignment steps of a plurality of mask levels with a beam selected from at least one of the group consisting of an uncharged particle beam, a charged particle beam, an uncharged photon beam, and a charged photon beam.

In accordance with a significant aspect of the invention, an adjusting method that achieves the above object is distinguished in that at least two alignment marks are applied or introduced onto or into the substrate of the mask or of the reticle in a first step before the first exposure step of the mask or of the reticle, in that, in a second step, at least the alignment marks produced in the first step and the regions immediately surrounding them are coated with a thin conducting layer, and in that, for all following alignment steps of the plurality of mask levels, these alignment marks applied in the first step are raster-scanned with an uncharged or charged particle or photon beam. Preferably, the mask device is a multilevel phase-shifting mask or a multilevel phase-shifting reticle.

In accordance with another feature of the invention, the same particle or photon beam is preferably and advantageously used for the alignment steps as for the exposure. The invention preferably uses an electron beam as the particle beam.

In accordance with a further mode of the invention, the dose and the current density of the particle or photon beam used for the raster-scanning of the alignment marks applied in the first step is set substantially lower than in the case of the exposure steps of the mask or of the reticle.

In accordance with an added mode of the invention, the thin conducting layer is preferably grounded during the raster-scanning of the alignment marks.

The thin conducting layer can, preferably, be applied over the whole surface of the substrate, that is to say, including over the previously exposed alignment marks. The configuration renders it possible for the manufacturer of the mask blank to supply the latter with the alignment marks and the thin conducting layer applied thereover.

In accordance with a concomitant mode of the invention, in the first step, the alignment marks can, for example, be etched into the substrate or, alternatively, also deposited thereon.

Overall, the present invention renders possible the detection of alignment marks, applied to the substrate or introduced into the substrate before the first exposure step, with a very high accuracy with the aid of charged and uncharged particle or photon beams, and, thereby, renders possible a very accurate positioning of a plurality of levels of a mask or a reticle one above another.

Other features that are considered as characteristic for the invention are set forth in the appended claims.

Although the invention is illustrated and described herein as embodied in a method for adjusting a multilevel phase-shifting mask, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Although a phase-shifting mask is addressed below, it should be clear to the person skilled in the art that it is equally possible, in this case, for it to be a reticle or a stencil mask.

Figure 1A:
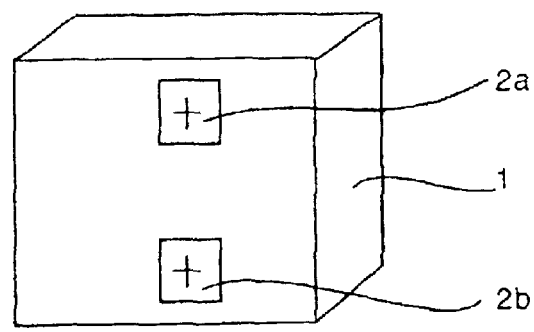
FIG. 1A is a fragmentary, diagrammatic, perspective view of a mask blank with alignment marks according to the invention.
Figure 1B:
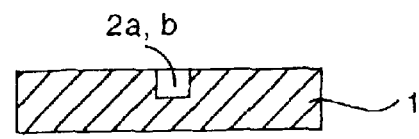
FIG. 1B is a fragmentary, diagrammatic, cross-sectional view of the mask blank of FIG. 1A with the alignment marks.

Referring now to the figures of the drawings in detail and first, particularly to FIG. 1 thereof, there is shown, in perspective, a substrate 1, provided with two alignment marks 2a, 2b, of a mask blank. FIG. 1B shows the same mask blank, that is to say, the substrate 1 provided with the alignment marks 2a, 2b, in a schematic cross-section. It must be remarked here that according to the invention at least two alignment marks are provided in the substrate 1 before the first exposure of the mask or the reticle. That is to say, it is also possible for more than two alignment marks to be provided. The alignment marks 2a, 2b can either be etched into the substrate 1 or deposited thereon.

Figure 2:
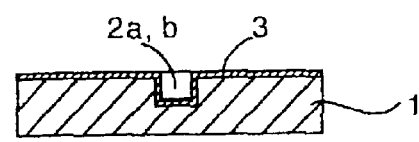
FIG. 2 is a fragmentary, diagrammatic, cross-sectional view of the mask blank of FIGS. 1A and 1B coated with a thin conducting layer according to the invention.

In accordance with FIG. 2, the substrate 1 with the alignment marks 2a, 2b etched therein or deposited thereon is coated over its whole surface with a thin conducting layer 3 that, if the alignment marks 2a, 2b are etched into the substrate 1, also covers the walls and the bottom of the depressions forming the alignment marks.

Figure 3:
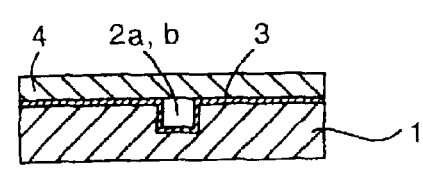
FIG. 3 is a fragmentary, diagrammatic, cross-sectional view of the mask blank of FIG. 2 covered with a resist layer according to the invention.

Subsequently, in accordance with FIG. 3 the structure shown in FIG. 2 is coated with a resist layer 4.

Figure 4:
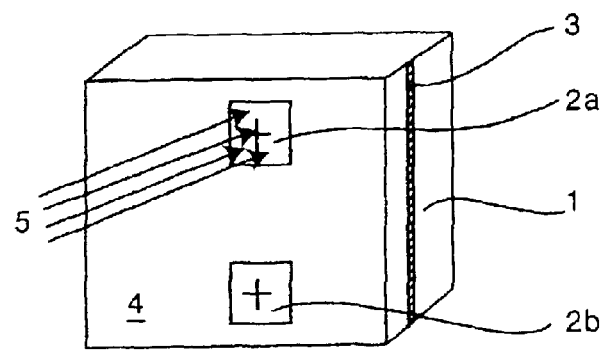
FIG. 4 is a fragmentary, diagrammatic, perspective view of the mask blank of FIG. 3 illustrating alignment of the alignment marks by raster-scanning with a charged or uncharged particle or photon beam.

In all following steps, the alignment marks 2a, 2b are raster-scanned (see FIG. 4) by an uncharged or charged particle or photon beam to carry out an alignment of the mask. By using an annular detector fitted over the mask or over the region thereof irradiated during the raster-scanning of the marks, it is possible to detect the marks 2a, 2b through the resist layer 4 and to detect a position of the marks 2a, 2b.

The invention preferably uses the beam that is also used for the exposure in raster-scanning the alignment marks 2a, 2b.

The dose and the current density of the beam are, for example, substantially lower in the case of the raster-scanning than in that of the exposure of the mask or the reticle.

In line with what has been described above, according to the invention, at least two alignment marks 2a, 2b are applied to the substrate 1 of the mask or the reticle, for example, by etching the marks 2a, 2b into the substrate before the first exposure of the mask or of the reticle. These alignment marks 2a, 2b can advantageously be formed at the manufacturer of the mask blank. In all later steps, these alignment marks 2a, 2b are then raster-scanned by an uncharged or charged particle or photon beam to carry out an alignment of the mask. The dose and the current density of the beam are substantially lower in this case than those in the exposure step of the mask or the reticle. Charging of the substrate during the raster-scanning of the alignment marks 2a, 2b with the aid of the particle or photon beam is avoided by a ground connection of the thin conducting layer 3 lying over the alignment marks.

We claim:

1. A method for adjusting a mask device, which comprises:
    in a first step, before a first exposure of a mask device having a substrate, one of:
        applying at least two alignment marks onto the substrate of the mask device; and
        introducing at least two alignment marks into the substrate of the mask device; and
    in a second step:
        coating at least the alignment marks and regions immediately surrounding the alignment marks with a conducting layer; and
        raster-scanning the alignment marks for all following alignment steps of a plurality of mask levels with a beam selected from at least one of the group consisting of:
            an uncharged particle beam;
            a charged particle beam;
            an uncharged photon beam; and
            a charged photon beam.

2. The method according to claim 1, which further comprises carrying out an exposure of the mask device with the same beam used for alignment.

3. The method according to claim 1, which further comprises carrying out the raster-scanning of the alignment marks with an electron beam.

4. The method according to claim 1, wherein the beam has a dose and a current density, and which further comprises setting the dose and the current density of the beam used for raster-scanning the alignment marks substantially lower than the dose and the current density used for exposing the mask device.

5. The method according to claim 2, wherein the beam has a dose and a current density, and which further comprises setting the dose and the current density of the beam used for raster-scanning the alignment marks substantially lower than the dose and the current density used for exposing the mask device.

6. The method according to claim 3, wherein the beam has a dose and a current density, and which further comprises setting the dose and the current density of the beam used for raster-scanning the alignment marks substantially lower than the dose and the current density used for exposing the mask device.

7. The method according to claim 1, which further comprises grounding the conducting layer during the raster-scanning of the alignment marks.

8. The method according to claim 1, which further comprises applying the conducting layer over an entire surface of the substrate in the second step.

9. The method according to claim 1, which further comprises etching the alignment marks into the substrate in the first step.

10. The method according to claim 1, wherein the mask device is one of a multilevel phase-shifting mask and a multilevel phase-shifting reticle.

11. The method according to claim 1, which further comprises carrying out the first step before a first exposure of one of a multilevel phase-shifting mask and a multilevel phase-shifting reticle.

12. The method according to claim 1, which further comprises carrying out the first step by applying at least two alignment marks onto the substrate of a multilevel phase-shifting mask.

13. The method according to claim 1, which further comprises carrying out the first step by applying at least two alignment marks onto the substrate of a multilevel phase-shifting reticle.

14. The method according to claim 1, which further comprises carrying out the first step by introducing at least two alignment marks into the substrate of a multilevel phase-shifting mask.

15. The method according to claim 1, which further comprises carrying out the first step by introducing at least two alignment marks into the substrate of a multilevel phase-shifting reticle.

16. A method for one of adjusting and aligning a multilevel phase-shifting mask, which comprises:
    in a first step, before a first exposure of the multilevel phase-shifting mask having a substrate, one of:
        applying at least two alignment marks onto the substrate of the mask; and
        introducing at least two alignment marks into the substrate of the mask; and in a second step:
  coating at least the alignment marks and regions immediately surrounding the alignment marks with a conducting layer; and
  raster-scanning the alignment marks for all following alignment steps of a plurality of mask levels with a beam selected from at least one of the group consisting of:
    an uncharged particle beam;
    a charged particle beam;
    an uncharged photon beam; and
    a charged photon beam.

17. A method for one of adjusting and aligning a multilevel phase-shifting reticle, which comprises:
  in a first step, before a first exposure of the multilevel phase-shifting reticle having a substrate, one of:
    applying at least two alignment marks onto the substrate of the reticle; and
    introducing at least two alignment marks into the substrate of the reticle; and
  in a second step:
    coating at least the alignment marks and regions immediately surrounding the alignment marks with a conducting layer; and
    raster-scanning the alignment marks for all following alignment steps of a plurality of mask levels with a beam selected from at least one of the group consisting of:
      an uncharged particle beam;
      a charged particle beam;
      an uncharged photon beam; and
      a charged photon beam.

* * * * *